United States Patent
Jung et al.

(10) Patent No.: US 11,737,220 B2
(45) Date of Patent: Aug. 22, 2023

(54) ELECTRONIC DEVICE INCLUDING AIR VENT

(71) Applicant: Samsung Electronics Co., Ltd., Suwon-si (KR)

(72) Inventors: Yanggyun Jung, Suwon-si (KR); Hosung Bang, Suwon-si (KR); Hyoungook Jo, Suwon-si (KR); Jinwan An, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 10 days.

(21) Appl. No.: 17/149,052

(22) Filed: Jan. 14, 2021

(65) Prior Publication Data
US 2021/0243907 A1    Aug. 5, 2021

(30) Foreign Application Priority Data
Jan. 30, 2020 (KR) .................. 10-2020-0010895

(51) Int. Cl.
*H05K 5/02* (2006.01)
*H05K 5/00* (2006.01)

(52) U.S. Cl.
CPC .......... *H05K 5/0213* (2013.01); *H05K 5/0017* (2013.01)

(58) Field of Classification Search
CPC ..... H05K 5/0213; H05K 5/0017; H05K 5/068
See application file for complete search history.

(56) References Cited

U.S. PATENT DOCUMENTS

| 9,806,758 B2 | 10/2017 | Miehl et al. |
| 9,999,149 B2 | 6/2018 | Jun et al. |
| 10,021,808 B1 * | 7/2018 | Nyland ............... H05K 5/0217 |

(Continued)

FOREIGN PATENT DOCUMENTS

| JP | 2001-007560 A | 1/2001 |
| JP | 2012-186549 A | 9/2012 |

(Continued)

OTHER PUBLICATIONS

Shinoda Takuya, "Waterproof Housing and Waterproof Device", Sep. 9, 2013, Denso Corp., Entire Document (Translation of JP 2013179364). (Year: 2013).*

(Continued)

*Primary Examiner* — Stephen S Sul
(74) *Attorney, Agent, or Firm* — Jefferson IP Law, LLP

(57) ABSTRACT

An electronic device is provided. The electronic device includes a housing including an opening, a first cover disposed in the housing to close the opening and includes a first surface facing the outside and a second surface facing an internal space of the housing, at least one air vent formed from the first surface to the second surface in a region of the first cover to connect the outside of the electronic device to the internal space and includes a first space formed to have a specified depth in a direction starting from the first surface to the second surface, and a second space formed to have a specified depth in a direction starting from the second surface to the first surface, wherein the first space and the second space are connected, and a breathable waterproof member disposed to close the second space in the second surface.

12 Claims, 14 Drawing Sheets

(56) References Cited

U.S. PATENT DOCUMENTS

| | | | |
|---|---|---|---|
| 2014/0161293 A1* | 6/2014 | Wang | H04R 1/021 |
| | | | 381/332 |
| 2014/0235156 A1* | 8/2014 | Li | G06F 1/203 |
| | | | 454/184 |
| 2015/0114090 A1* | 4/2015 | Fukuda | F21V 33/0052 |
| | | | 362/253 |
| 2016/0179139 A1* | 6/2016 | Ahn | G06F 1/1626 |
| | | | 361/679.3 |
| 2018/0241861 A1 | 8/2018 | Kim et al. | |
| 2019/0191580 A1 | 6/2019 | Yang et al. | |
| 2019/0196560 A1* | 6/2019 | Cha | G06F 1/203 |
| 2021/0034114 A1* | 2/2021 | Cha | H05K 5/0086 |

FOREIGN PATENT DOCUMENTS

| | | | | |
|---|---|---|---|---|
| JP | 2013-179364 A | | 9/2013 | |
| JP | 2013179364 A | * | 9/2013 | B60R 16/00 |
| KR | 10-2015-0049292 A | | 5/2015 | |

OTHER PUBLICATIONS

International Search Report dated Apr. 23, 2021, issued in International Application No. PCT/KR2021/000511.

* cited by examiner

ELECTRONIC DEVICE INCLUDING AIR VENT

CROSS-REFERENCE TO RELATED APPLICATION(S)

This application is based on and claims priority under 35 U.S.C. § 119(a) of a Korean patent application number 10-2020-0010895, filed on Jan. 30, 2020, in the Korean Intellectual Property Office, the disclosure of which is incorporated by reference herein its entirety.

BACKGROUND

1. Field

The disclosure relates to an electronic device including an air vent. More particularly, the disclosure relates to an electronic device including an air vent formed in the cover, housing, or window to remove the air pressure difference between a sealed internal space of the electronic device and an external environment by inducing an air flow.

DESCRIPTION OF RELATED ART

As the functional gap between manufacturers is significantly reduced, electronic devices are becoming slimmer to meet consumer's purchasing needs. In addition, electronic devices are being upgraded by increasing rigidity, enhancing design aspects, and differentiating their functions. As part of functional differentiation, an electronic device may have a waterproof function. This waterproof function can extend the life of the electronic device by preventing the inflow of moisture and/or foreign substances from the outside, but side effects due to the sealed structure need to be reduced as well.

The above information is presented as background information only to assist with an understanding of the disclosure. No determination has been made, and no assertion is made, as to whether any of the above might be applicable as prior art with regard to the disclosure.

SUMMARY

An electronic device may have a waterproof structure to prevent the inflow of moisture and/or foreign substances from the outside. For example, the electronic device may have an internal space sealed from the external space through a waterproof member (e.g., a waterproof tape) disposed between at least one cover (e.g., a front cover and/or a rear cover) and a side frame (e.g., a side member or a side bezel structure). Due to the sealed space, there may be an air pressure difference between the internal space of the electronic device and the outside. Such an air pressure difference may cause a malfunction, such as fogging on the window (e.g., a display window, a camera window, or a sensor window), an operation failure of the air pressure sensor, or a poor restoration of the receiver diaphragm in a low frequency band. To address this issue, the electronic device may include at least one air vent formed in the cover, housing, or window to remove the air pressure difference between the sealed internal space of the electronic device and the external environment by inducing an air flow. This air vent may maintain a waterproof function by means of a breathable waterproof member (e.g., Gore-Tex) that passes air and blocks moisture and/or foreign substances in the internal space of the electronic device.

However, the breathable waterproof member is vulnerable to impact, and may be torn or damaged by the water pressure of incoming moisture (e.g., water stream) and thus the waterproof function may be lost.

Aspects of the disclosure are to address at least the above-mentioned problems and/or disadvantages and to provide at least the advantages described below. Accordingly, an aspect of the disclosure is to provide an electronic device including an air vent.

Additional aspects will be set forth in part in the description which follows and, in part, will be apparent from the description, or may be learned by practice of the presented embodiments In accordance with an aspect of the disclosure, an electronic device is provided. The electronic device includes an air vent that is configured to prevent damage to the waterproof member by reducing the water pressure.

In accordance with another aspect of the disclosure, an electronic device is provided. The electronic device includes an air vent that has a structure for not only reducing the water pressure but also inducing a smooth air flow.

In accordance with another aspect of the disclosure, an electronic device is provided. The electronic device includes a housing including an opening connected to an internal space, a first cover that is disposed in the housing to close the opening and includes a first surface facing an outside and a second surface facing the internal space, at least one air vent that is formed from the first surface to the second surface in at least some region of the first cover to connect the outside of the electronic device to the internal space and includes a first space formed to have a specified depth in a direction from the first surface to the second surface, and a second space formed to have a specified depth in a direction from the second surface to the first surface, wherein the first space and the second space are connected so as to partially overlap each other or so as not to overlap each other when the first surface is viewed from above, and a breathable waterproof member disposed to close the second space in the second surface.

In accordance with another aspect of the disclosure, an electronic device is provided. The electronic device includes a housing that includes a sealed internal space, a first surface in contact with the outside, and a second surface in contact with the internal space, at least one air vent that is formed from the first surface to the second surface in at least some region of the housing to connect the outside of the electronic device and the internal space and includes a first space formed to have a specified depth in a direction from the first surface to the second surface, and a second space formed to have a specified depth in a direction from the second surface to the first surface, wherein the first space and the second space are connected so as to partially overlap each other or so as not to overlap each other when the first surface is viewed from above, and a breathable waterproof member disposed to close the second space in the second surface.

In accordance with another aspect of the disclosure, an electronic device is provided. The electronic device includes a housing that includes a front plate, a rear plate spaced apart from the front plate and including an opening, and a side frame surrounding an internal space between the front plate and the rear plate, at least one camera device arranged in the internal space, a cover that is disposed on the rear plate to close the opening and includes a first surface facing the outside, a second surface facing the internal space, and at least one through hole formed at a position corresponding to the at least one camera device, the at least one air vent that is formed from the first surface to the second surface in at least some region of the cover to connect the outside of the electronic device to the internal space and includes a first space formed to have a specified depth in a direction from the first surface to the second surface, and a second space formed to have a specified depth in a direction from the second surface to the first surface, wherein the first space and the second space are connected so as to partially overlap each other or so as not to overlap each other when the first surface is viewed from above, the at least one air vent including a first air vent and a second air vent, a window attached to the cover through an adhesive tape to cover the at least one air vent, a connection passage that is formed on the adhesive tape and connects the outside of the electronic device to the at least one air vent through a space between the window and the cover and includes a first passage connected to the outside, a second passage branching from the first passage and connected to the first air vent, and a third passage branching from the first passage and connected to the second air vent, and a breathable waterproof member disposed to close the second space in the second surface.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description, taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
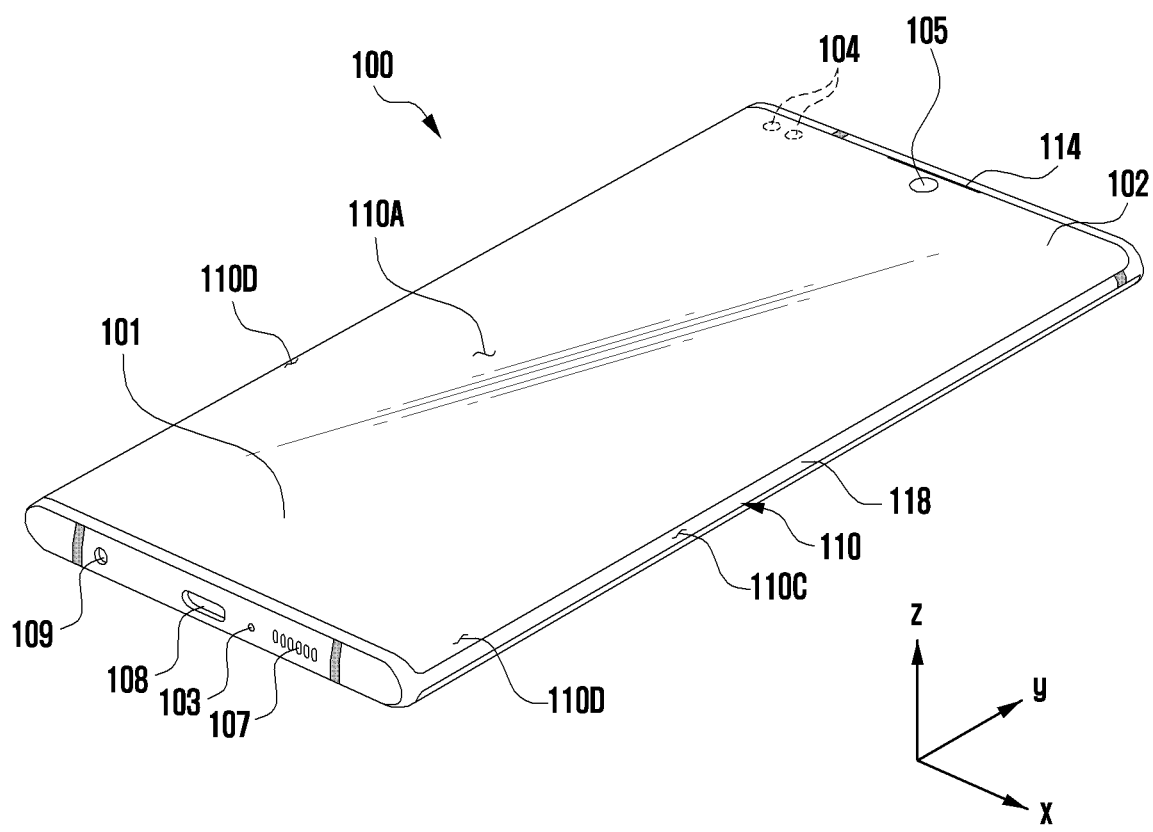
FIG. 1 is a front perspective view of a mobile electronic device according to an embodiment of the disclosure.
Figure 2:
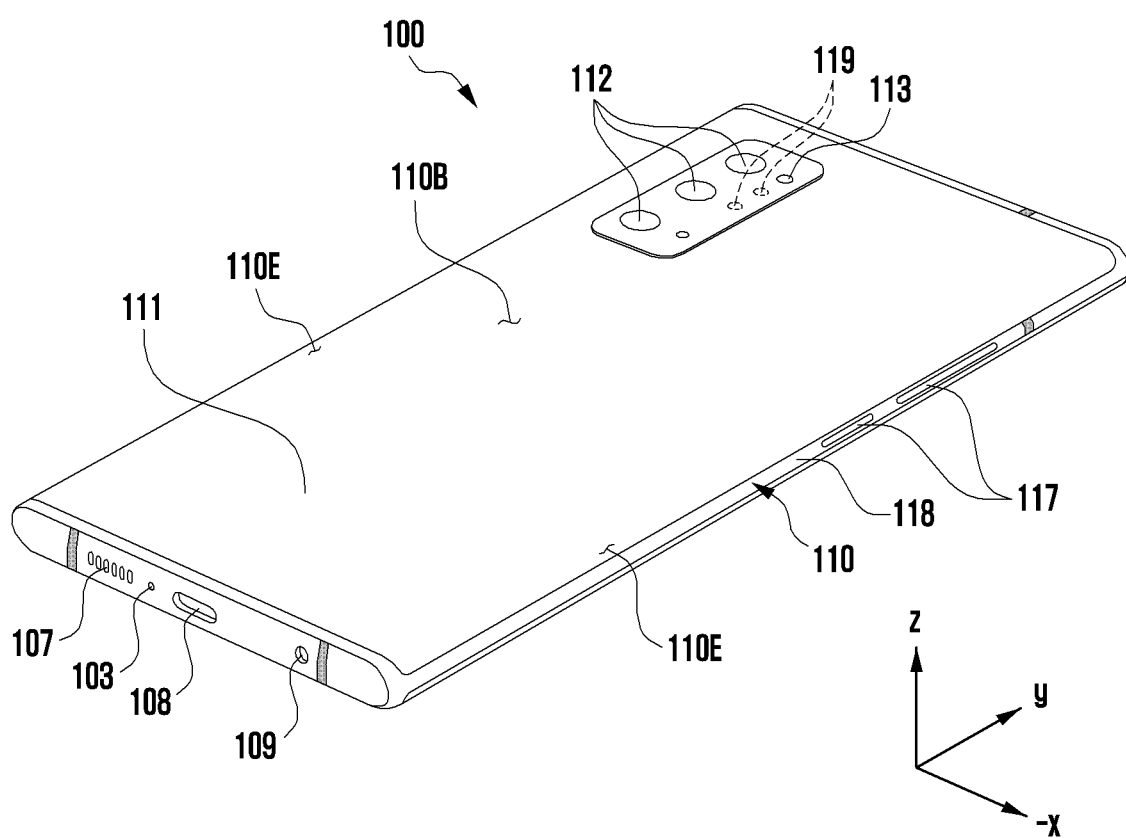
FIG. 2 is a rear perspective view of an electronic device of FIG. 1 according to an embodiment of the disclosure.

FIG. 1 illustrates a perspective view showing a front surface of a mobile electronic device according to an embodiment of the disclosure, and FIG. 2 illustrates a perspective view illustrating a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material, such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch detection circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to detect a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The mobile electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the mobile electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the mobile electronic device 100.

The key input device 117 may be disposed on the lateral surface 110C of the housing 110. The mobile electronic device 100 may not include some or all of the key input device 117 described above, and the key input device 117 which is not included may be implemented in another form, such as a soft key on the display 101. The key input device 117 may include the sensor module disposed on the second surface 110B of the housing 110.

The light emitting device may be disposed on the first surface 110A of the housing 110. For example, the light emitting device may provide status information of the mobile electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of the mobile electronic device 100 so as to be brought into contact with an external environment through an opening of the display 101, which is perforated up to a front plate 102. In another embodiment of the disclosure, some sensor modules 104 may be arranged to perform their functions without being visually exposed through the front plate 102 in the internal space of the electronic device. For example, in this case, an area of the display 101 facing the sensor module may not require a perforated opening.

Figure 3:
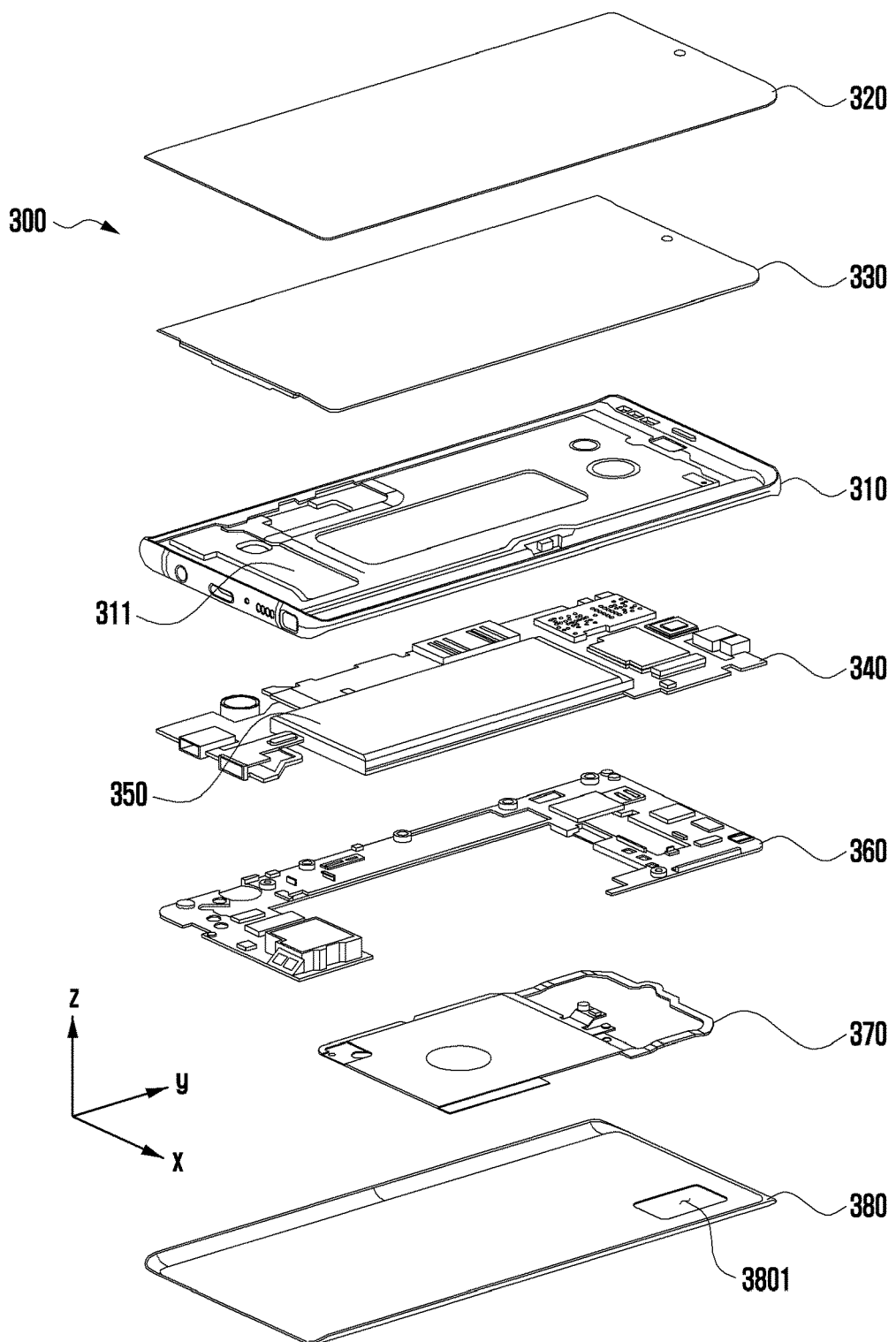
FIG. 3 is an exploded perspective view of an electronic device of FIG. 1 according to an embodiment of the disclosure.

FIG. 3 illustrates an exploded perspective view illustrating a mobile electronic device shown in FIG. 1 according to an embodiment of the disclosure.

Referring to FIG. 3, an electronic device 300 (e.g., mobile electronic device 100 in FIG. 1) may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the electronic device 300, and may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to various embodiments of the disclosure, the electronic device 300 may include at least one electronic component (e.g., camera module or sensor module) disposed in the internal space to detect or monitor the external environment. In one embodiment of the disclosure, the electronic components may detect or monitor the external environment through an opening 3801 formed on the rear plate 380, and the opening 3801 may be sealed by at least one cover (e.g., decorative member or window).

Figure 4:
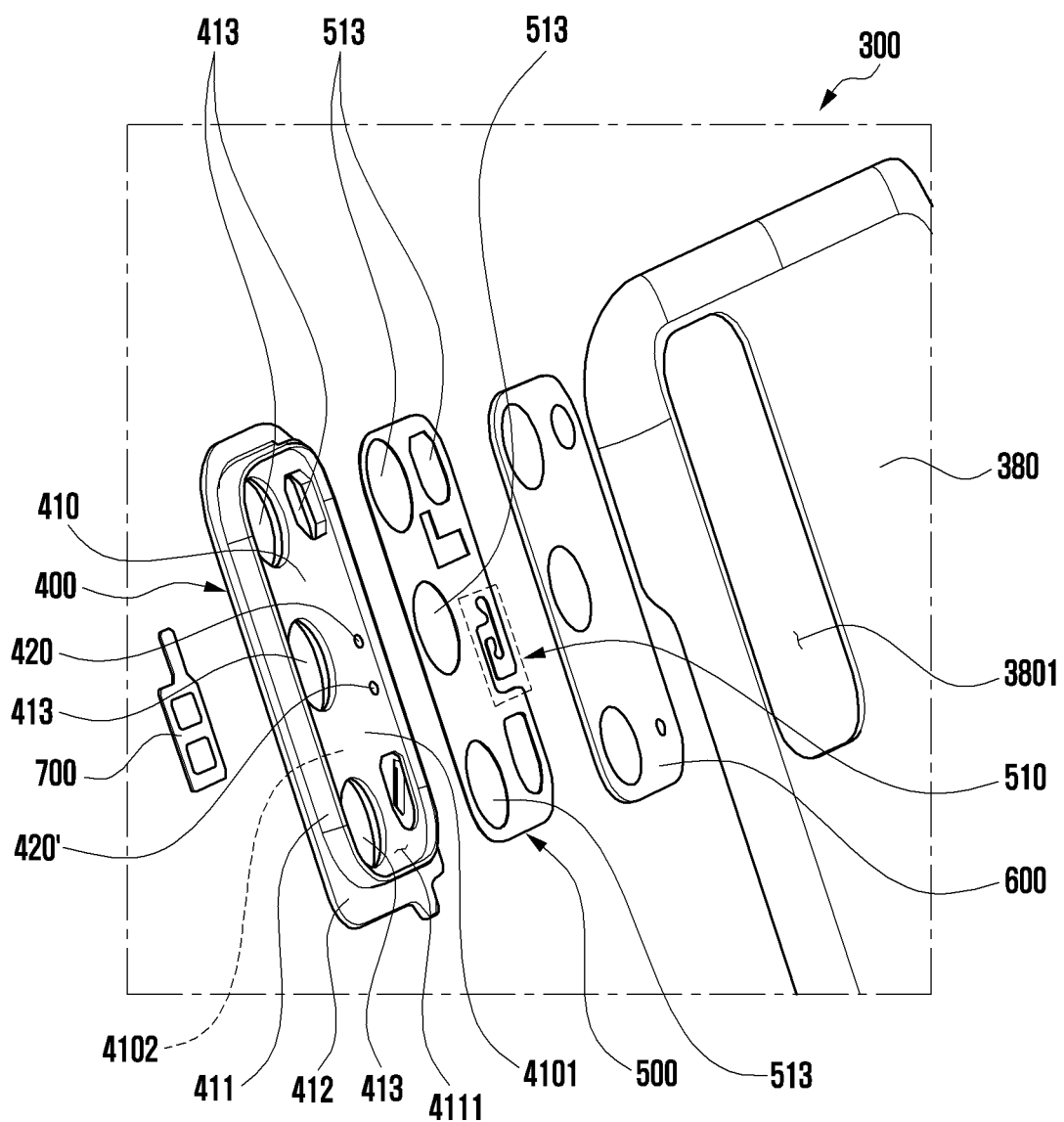
FIG. 4 is a partial perspective view of an electronic device illustrating a cover assembly structure according to an embodiment of the disclosure.

FIG. 4 is a partial perspective view of an electronic device illustrating a cover assembly structure according to an embodiment of the disclosure.

The electronic device 300 of FIG. 4 may be at least partially similar to the mobile electronic device 100 of FIG. 1 or 2, or may further include other embodiments of an electronic device.

Referring to FIG. 4, the electronic device 300 may include a rear plate 380 (e.g., rear cover) including an opening 3801, a first cover 400 sealing the opening 3801, a second cover 600 disposed on the first cover 400, and an adhesive member 500 attaching the second cover 600 to the first cover 400. In one embodiment of the disclosure, the electronic device 300 may include at least one electronic component (e.g., camera module 112 or sensor module 119 in FIG. 2) disposed in the internal space. In one embodiment of the disclosure, the at least one electronic component may be disposed to detect the external environment through the first cover 400 sealing the opening 3801 of the rear plate 380 and the second cover 600.

In various embodiments of the disclosure, the first cover 400 may include a plate part 410 formed to have substantially the same size as the opening 3801, a partition wall 411 protruding to a specified height along the rim of the plate part 410, and a flange 412 extending outward along the rim of the partition wall 411. In one embodiment of the disclosure, the flange 412 may be attached to the rear plate 380 through a waterproof tape (e.g., waterproof tape 381 in FIG. 5B) that overlaps the inner surface of the rear plate 380 and is disposed between the flange 412 and the rear plate 380. In one embodiment of the disclosure, the plate part 410 of the first cover 400 may include a first surface 4101 facing the outside of the electronic device 300 and a second surface 4102 facing the internal space of the electronic device 300 in a direction opposite to the first surface 4101. In one embodiment of the disclosure, the first cover 400 may include at least one through hole 413 formed in the plate part 410. In one embodiment of the disclosure, the at least one through hole 413 may be formed at a position facing at least one electronic component arranged in the internal space of the electronic device 300. In one embodiment of the disclosure, the first cover 400 may include at least one air vent 420 and 420' connected from the first surface 4101 to the second surface 4102. In one embodiment of the disclosure, the at least one air vent 420 and 420' may include a first air vent 420 disposed at a designated position in the plate part 410 of the first cover 400 and a second air vent 420' disposed near the first air vent 420. The first air vent 420 and the second air vent 420' may have substantially the same structure. In a certain embodiment of the disclosure, the first air vent 420 and the second air vent 420' may have different structures. In one embodiment of the disclosure, the at least one air vent 420 and 420' may block moisture and/or foreign substances introduced from the outside by use of a breathable waterproof member 700 (e.g., breathable waterproof material) disposed on the second surface 4202. In one embodiment of the disclosure, the breathable waterproof member 700 may include Gore-Tex, a waterproof nonwoven fabric, or a membrane. In one embodiment of the disclosure, the first cover 400 may serve as a decorative member by exposing at least a portion of the partition wall 411 to the outside of the electronic device. In one embodiment of the disclosure, the first cover 400 may be made of a metal or a polymer (e.g., polycarbonate (PC)).

In various embodiments of the disclosure, the adhesive member 500 may be disposed between the first cover 400 and the second cover 600, and may include a non-adhesive region 513 formed at a position corresponding to the at least one through hole 413 of the first cover 400. In one embodiment of the disclosure, the adhesive member 500 may include a connection passage 510 disposed at a position corresponding to the at least one air vent 420 and 420' through another non-adhesive region. The connection passage 510 may be formed to have a structure, from at least a portion between the second cover 600 and the partition wall 411 to the at least one air vent 420 and 420', connected to the external environment. In one embodiment of the disclosure, the adhesive member 500 may include an adhesive tape having a specified thickness.

In various embodiments of the disclosure, the second cover 600 may be disposed by being seated on a seating portion 4111 formed on the plate part 410 through the partition wall 411 of the first cover 400. In one embodiment of the disclosure, the second cover 600 may be attached to the seating portion 4111 of the first cover 400 through the adhesive member 500, and may help to form the connection passage 510 through the first surface 4101 of the plate part 410 and the adhesive member 500. In one embodiment of the disclosure, the second cover 600 may include a window for inducing at least one electronic component to detect the external environment. In one embodiment of the disclosure, the second cover 600 may be made of transparent or translucent glass or polymer.

In various embodiments of the disclosure, the electronic device 300 includes the at least one air vent 420 and 420' having a structure for reducing the water pressure of incoming moisture and/or the connection passage 510 through a non-adhesive region of the adhesive member 500, which may contribute to the effective waterproof function by preventing damage, such as tearing of the breathable waterproof member 700. At the same time, the at least one air vent 420 and 420 and/or the connection passage 510 of the adhesive member 500 may ventilate the internal space of the electronic device 300 to the outside, contributing to reducing side effects caused by the air pressure difference.

Thereafter, a detailed description is given of the structure of the connection passage 510 using the adhesive member 500 provided by the electronic device 300 and the at least one air vent 420 and 420' connected to the connection passage 510.

Figure 5A:
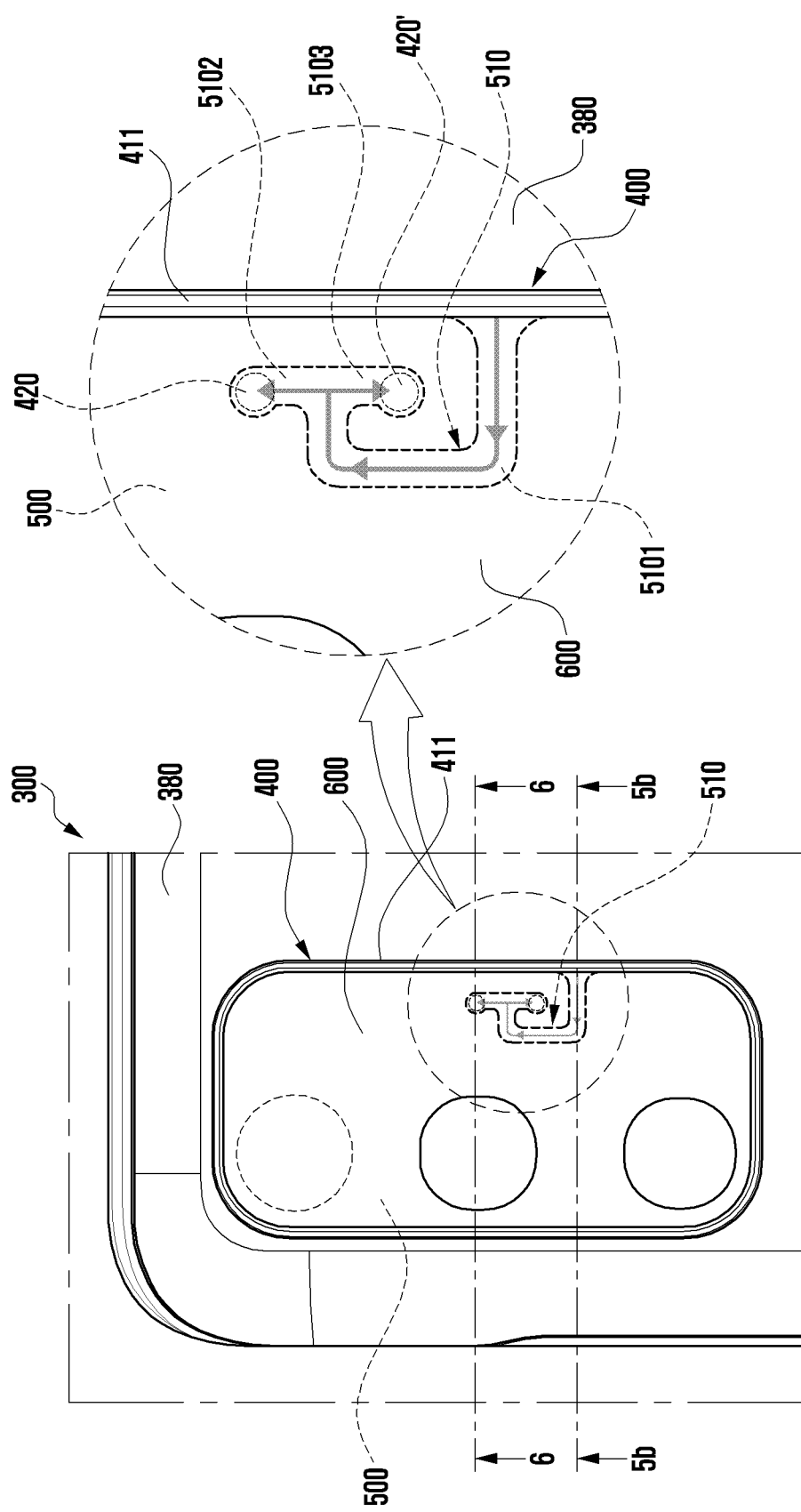
FIG. 5A is a partial view of an electronic device including a connection passage of an adhesive member connected to an air vent according to an embodiment of the disclosure.
Figure 5B:
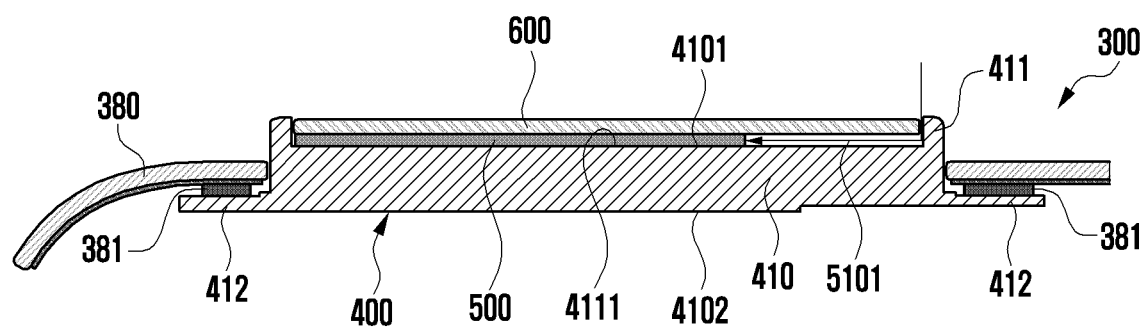
FIG. 5B is a partial cross-sectional view of an electronic device viewed from a line 5b-5b in FIG. 5A according to an embodiment of the disclosure.

FIG. 5A is a partial view of an electronic device including a connection passage of an adhesive member connected to air vents 420 and 420' according to an embodiment of the disclosure. FIG. 5B is a partial cross-sectional view of an electronic device viewed from a line 5b-5b in FIG. 5A according to an embodiment of the disclosure.

Referring to FIGS. 5A and 5B, the electronic device 300 may include a rear plate 380 including an opening (e.g., opening 3801 in FIG. 4), a first cover 400 disposed to close the opening 3801, and a second cover 600 disposed on the first cover 400. In one embodiment of the disclosure, the second cover 600 may be attached to the first cover 400 through the adhesive member 500. In one embodiment of the disclosure, the first cover 400 may be attached to the rear plate 380 through a waterproof tape 381 disposed between the flange 412 and the inner surface of the rear plate 380.

In various embodiments of the disclosure, the electronic device 300 may include a connection passage 510 configured to connect the outside of the electronic device 300 and at least one air vent 420 and 420' through a non-adhesive region of the adhesive member 500 disposed between the first cover 400 and the second cover 600. In one embodiment of the disclosure, the connection passage 510 may include a first passage 5101 connected to the outside, the second passage 5102 branching from a portion of the first passage 5101 and connected to the first air vent 420, and a third passage 5103 branching from a portion of the first passage 5101 and connected to the second air vent 420'. In one embodiment of the disclosure, the second passage 5102 and the third passage 5103 may branch from an end of the first passage 5101 at the same position. In one embodiment of the disclosure, the first passage 5101 may be connected to the outside from a space between the partition wall 411 of the first cover 400 and the second cover 600. Hence, air and/or moisture from the outside of the electronic device 300 may flow in through the first passage 5101 and may branch to the first air vent 420 and the second air vent 420' through the second passage 5102 and the third passage 5103 having a branching structure. For example, moisture introduced from the outside through the first passage 5101 may branch to the second passage 5102 and the third passage 5103 having a branching structure, so that the water pressure can be reduced. This reduced water pressure may help prevent damage to the breathable waterproof member (e.g., breathable waterproof member 700 in FIG. 4).

Figure 6:
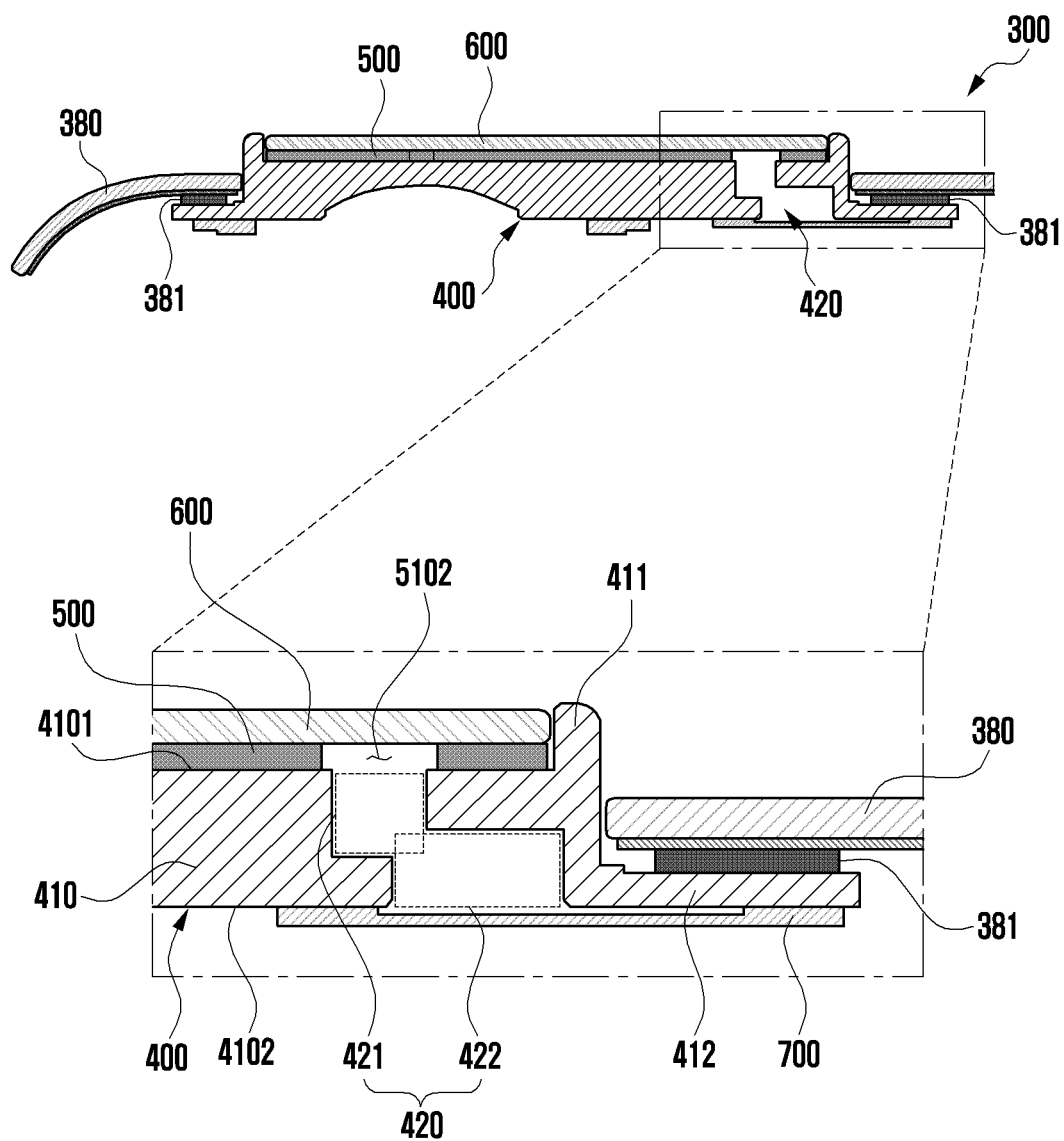
FIG. 6 is a partial cross-sectional view of an electronic device viewed from a line 6-6 in FIG. 5A according to an embodiment of the disclosure.

FIG. 6 is a partial cross-sectional view of an electronic device viewed from a line 6-6 in FIG. 5A according to an embodiment of the disclosure.

Referring to FIG. 6, the structure of the first air vent connected to the second passage is illustrated and described, but the structure of the second air vent connected to the third passage may also be substantially the same.

Referring to FIG. 6, the electronic device 300 may include a rear plate 380 including an opening (e.g., opening 3801 in FIG. 4), a first cover 400 disposed to close the opening 3801, and a second cover 600 disposed on the first cover 400. In one embodiment of the disclosure, the second cover 600 may be attached to the first cover 400 through an adhesive member 500. In one embodiment of the disclosure, the first cover 400 may be attached to the rear plate 380 through a waterproof tape 381 disposed between the flange 412 and the inner surface of the rear plate 380.

In various embodiments of the disclosure, the first air vent 420 may include a first space 421 formed to have a specified depth in a direction from the first surface 4101 of the plate part 410 of the first cover 400 to the second surface (e.g., in a direction toward the internal space of the electronic device), and a second space 422 formed to have a specified depth in a direction from the second surface to the first surface (e.g., in a direction toward the outside of the electronic device) and connected to the first space 421. In one embodiment of the disclosure, the first space 421 may be disposed to partially overlap the second space 422 when the first surface 4101 is viewed from above. In one embodiment of the disclosure, the first space 421 and the second space 422 may have a cross section of at least one of a circle, an ellipse, or a polygon. For example, the first air vent 420 may help to reduce the water pressure of moisture flowing from the second passage 5102 by means of a bent connection structure of the partially overlapping first space 421 and second space 422, which can prevent damage to the breathable waterproof member 700, such as tearing.

Figure 7:
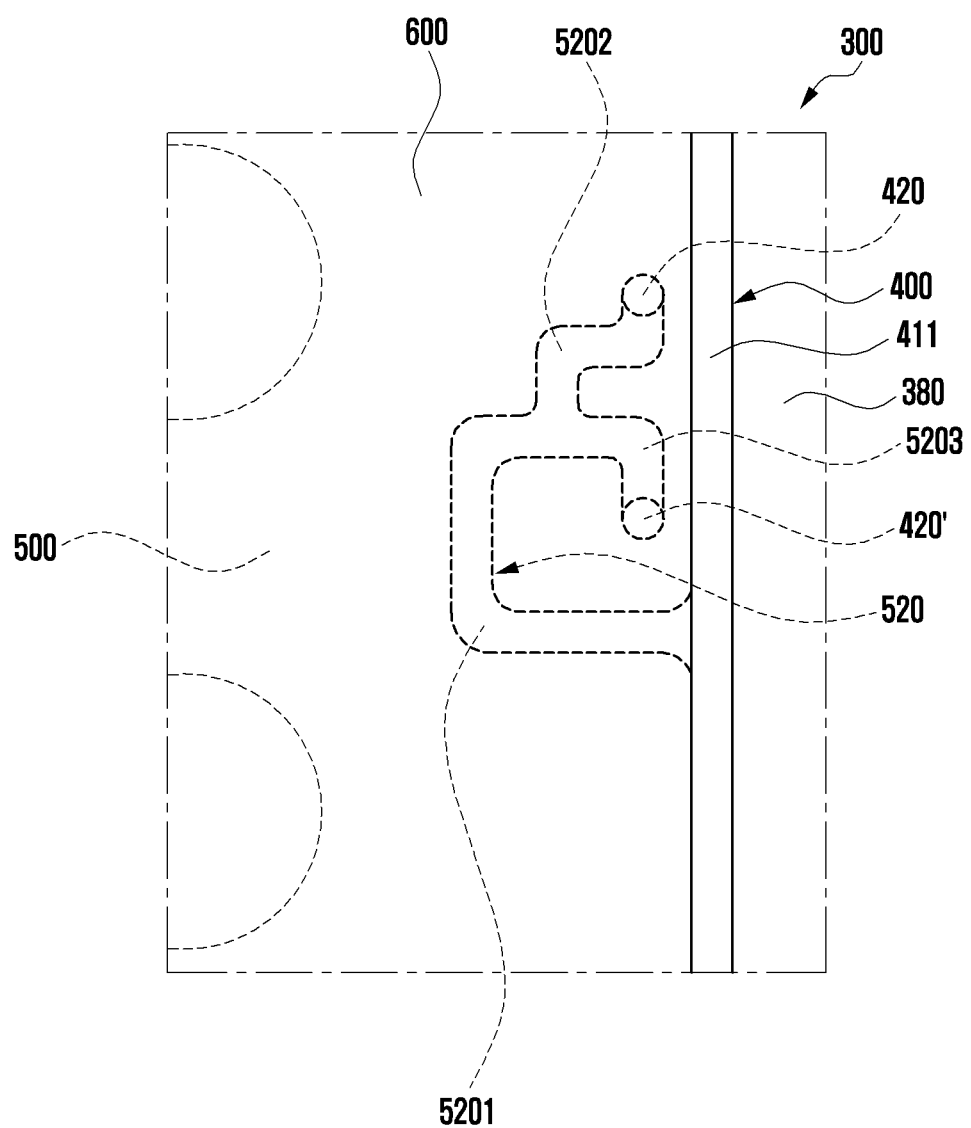
FIG. 7 is a partial view of an electronic device illustrating a connection passage structure of an adhesive member connected to an air vent according to an embodiment of the disclosure.

FIG. 7 is a partial view of an electronic device illustrating a connection passage structure of an adhesive member connected to an air vent according to an embodiment of the disclosure.

Referring to FIG. 7, the connection passage 520 formed through the non-adhesive region of the adhesive member 500 disposed between the first cover 400 and the second cover 600 may have a branching structure different from that of FIG. 5A. For example, the connection passage 520 may include a first passage 5201 connected to the outside, the second passage 5202 branching from a portion of the first passage 5201 and connected to the first air vent 420, and a third passage 5203 branching from another portion of the first passage 5101 and connected to the second air vent 420'. In one embodiment of the disclosure, the first passage 5201 may be connected to a space between the partition wall 411 of the first cover 400 exposed from the rear plate 380 and the second cover 600. In one embodiment of the disclosure, the second passage 5202 and the third passage 5203 may branch at different positions of the first passage 5201 and be connected respectively to the air vents 420 and 420'. In a certain embodiment of the disclosure, when the electronic device 300 includes three or more air vents in the first cover 400, the connection passage may be configured to have three or more passages each branching from the first passage.

FIGS. 8A, 8B, 8C, 8D and 8E are partial cross-sectional views of an electronic device including an air vent according to various embodiments of the disclosure.

In the description on FIGS. 8A, 8B, 8C, 8D, and 8E, components that are substantially the same as those of FIG.

6 are assigned the same reference numerals, and repeated descriptions thereof may be omitted.

Figure 8A:
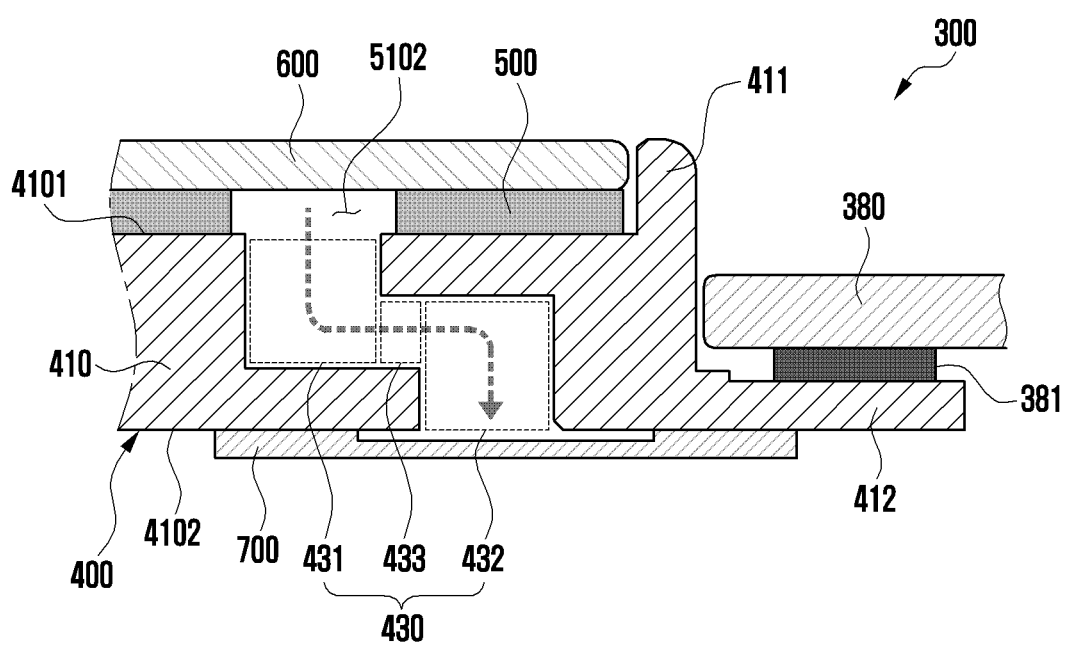
FIGS. 8A, 8B, 8C, 8D and 8E are partial cross-sectional views of an electronic device including an air vent according to various embodiments of the disclosure.

Referring to FIG. 8A, the electronic device 300 may include a rear plate 380 including an opening (e.g., opening 3801 in FIG. 4), a first cover 400 disposed to close the opening 3801, and a second cover 600 disposed on the first cover 400. In one embodiment of the disclosure, the second cover 600 may be attached to the first cover 400 through an adhesive member 500. In one embodiment of the disclosure, the first cover 400 may be attached to the rear plate 380 through a waterproof tape 381 disposed between the flange 412 and the inner surface of the rear plate 380.

In various embodiments of the disclosure, the air vent 430 may include a first space 431 formed to have a specified depth in a direction from the first surface 4101 of the plate part 410 of the first cover 400 to the second surface, a second space 432 formed to have a specified depth in a direction from the second surface 4102 to the first surface, and a third space 433 connecting the first space 431 and the second space 432. In this case, the first space 431 may be disposed so as not to overlap the second space 432 when the first surface 4101 is viewed from above, and may be spatially connected to the second space 432 through the third space 433. Hence, the air vent 430 may help to reduce the water pressure of moisture flowing from the second passage 5102 by means of a bent connection structure of the non-overlapping first space 431 and second space 432 and the third space 433 connecting them.

Figure 8B:
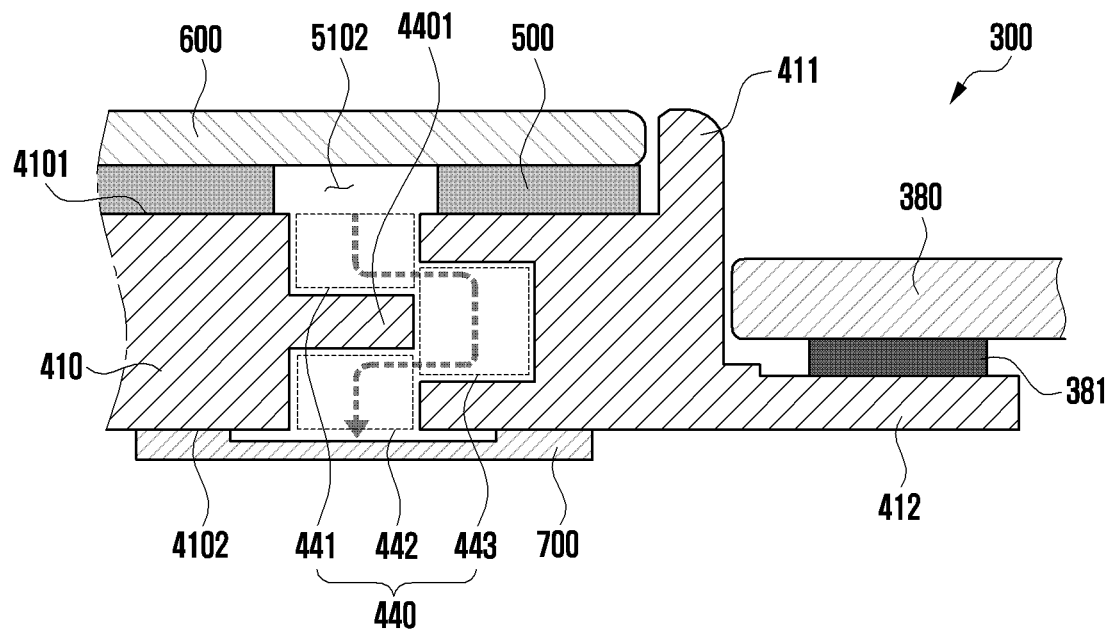

Referring to FIG. 8B, the air vent 440 may include a first space 441 formed to have a specified depth in a direction from the first surface 4101 of the plate part 410 of the first cover 400 to the second surface, a second space 442 formed to have a specified depth in a direction from the second surface 4102 to the first surface, and a third space 443 connecting the first space 441 and the second space 442. In one embodiment of the disclosure, when the first surface 4101 is viewed from above, the first space 441 may be disposed to overlap the second space 442, and the third space 443 may be disposed at a position not overlapping the first space 441 and the second space 442 between the first space 441 and the second space 442. In this case, the air vent 440 may include a protrusion 4401 projecting in a direction toward the third space 443 between the first space 441 and the second space 442. In one embodiment of the disclosure, the protrusion 4401 may provide a curved structure in which moisture flowing from the first space 441 through the second passage 5102 is not directly transferred to the second space 442 but takes a detour through the third space 443, which can help reduce the water pressure. In a certain embodiment of the disclosure, the third space 443 may be disposed to partially overlap the first space 441 and/or the second space 442 when the first surface 4101 is viewed from above.

Figure 8C:
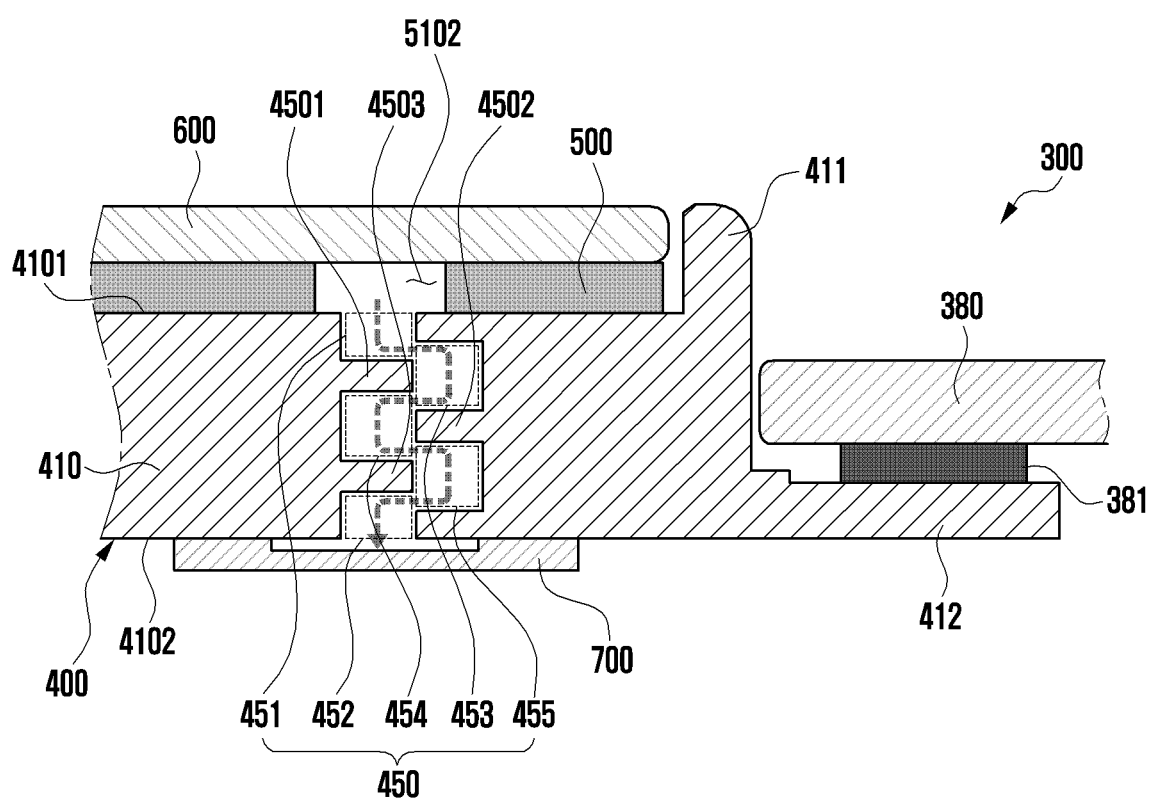

Referring to FIG. 8C, the air vent 450 may include a first space 451 formed to have a specified depth in a direction from the first surface 4101 of the plate part 410 of the first cover 400 to the second surface 4102, a second space 452 formed to have a specified depth in a direction from the second surface 4102 to the first surface 4101, and plural spaces 453, 454, and 455 connecting the first space 451 and the second space 452. In one embodiment of the disclosure, the plural spaces 453, 454, and 455 may include a third space 453, a fourth space 454, and a fifth space 455 formed sequentially in a direction from the first space 451 to the second space 452. In one embodiment of the disclosure, the first space 451 may be disposed to overlap the second space 452 and the fourth space 454 when the first surface 4101 is viewed from above. In one embodiment of the disclosure, the third space 453 may be disposed at a position not overlapping the first space 451 between the first space 451 and the fourth space 454. In one embodiment of the disclosure, the fifth space 455 may be disposed at a position not overlapping the first space 451 between the fourth space 454 and the second space 452. In one embodiment of the disclosure, the air vent 450 may include a first protrusion 4501 projecting in a direction toward the third space 453 between the first space 451 and the fourth space 454. In one embodiment of the disclosure, the air vent 450 may include a second protrusion 4502 projecting in a direction toward the fourth space 454 between the third space 453 and the fifth space 455. In one embodiment of the disclosure, the air vent 450 may include a third protrusion 4503 projecting in a direction toward the fifth space 455 between the fourth space 454 and the second space 452. In one embodiment of the disclosure, the first to third protrusions 4501, 4502, and 4503 may provide a curved structure in which moisture flowing from the first space 451 through the second passage 5102 is not directly transferred to the second space 452 but takes a detour multiple times through the third to fifth spaces 453, 454, and 455, which can help reduce the water pressure. In a certain embodiment of the disclosure, the third space 453 and the fifth space 455 may be disposed to partially overlap the first space 451 and/or the second space 452 when the first surface 4101 is viewed from above.

Figure 8D:
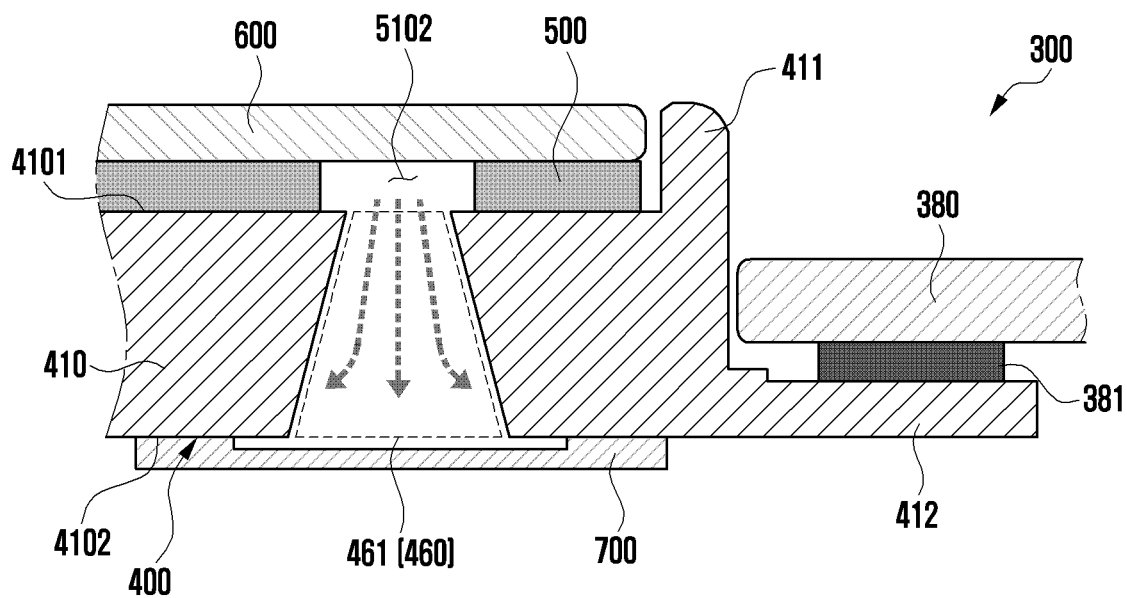

Referring to FIG. 8D, the air vent 460 may be formed as a space 461 having a shape whose width (e.g., area) gradually increases as going from the first surface 4101 of the first cover 400 to the second surface 4102. In this case, the water pressure of moisture flowing into the air vent 460 through the second passage 5102 may be reduced due to the structure whose width gradually widens, which may help to prevent damage to the breathable waterproof member 700.

Figure 8E:
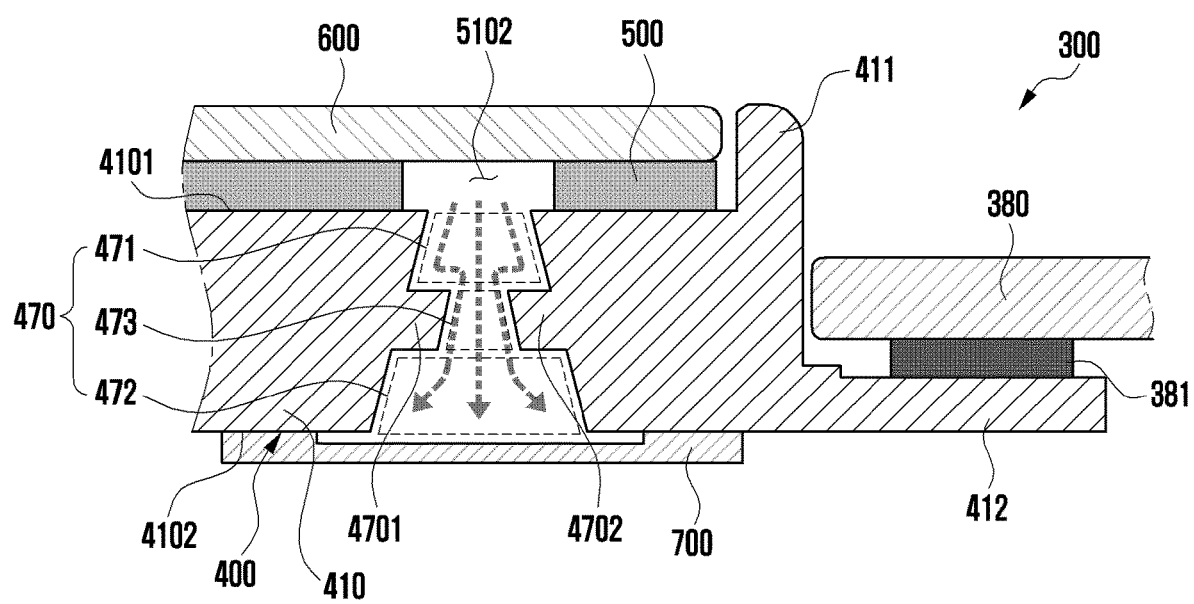

Referring to FIG. 8E, the air vent 470 may further include protrusions 4701 and 4702 extending inward in addition to the structure of the air vent 460 of FIG. 8D whose width gradually increases. For example, the air vent 470 may include a first space 471 formed to have a specified depth in a direction from the first surface 4101 of the plate part 410 of the first cover 400 to the second surface 4102, a second space 472 formed to have a specified depth in a direction from the second surface 4102 to the first surface 4101, and a third 473 connecting the first space 471 and the second space 472 through the protrusions 4701 and 4702. In one embodiment of the disclosure, the protrusions 4701 and 4702 may be formed on the same virtual line or may be formed on different virtual lines. In one embodiment of the disclosure, because moisture flowing from the first space 471 through the second passage 5102 is guided to the second space 472 after the water pressure is reduced through the protrusions 4701 and 4702, the air vent 470 may help prevent damage to the breathable waterproof member 700.

Figure 9:
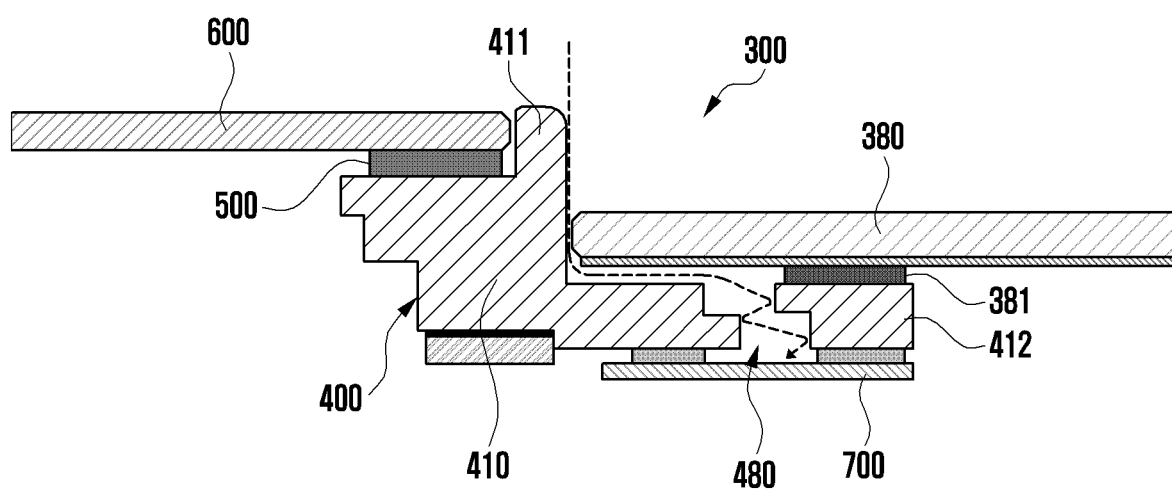
FIG. 9 is a partial cross-sectional view of an electronic device including an air vent according to an embodiment of the disclosure.

FIG. 9 is a partial cross-sectional view of an electronic device including an air vent according to an embodiment of the disclosure.

Referring to FIG. 9, the electronic device 300 may include a rear plate 380 including an opening (e.g., opening 3801 in FIG. 4), a first cover 400 disposed to close the opening 3801, and a second cover 600 disposed on the first cover 400. In one embodiment of the disclosure, the second cover 600 may be attached to the first cover 400 through an adhesive member 500. In one embodiment of the disclosure, the first cover 400 may be attached to the rear plate 380 through a waterproof tape 381 disposed between the flange 412 and the inner surface of the rear plate 380.

In various embodiments of the disclosure, the air vent 480 may be formed through the flange 412 of the first cover 400. In this case, the air vent 480 may be connected to the outside through a space between the rear plate 380 and the first cover 400. In a certain embodiment of the disclosure, the air vent 480 may be replaced with at least one of the air vents 420, 430, 440, 450, 460, and 470 having various configurations formed on the plate part 410 of the first cover 400 described above. In another embodiment of the disclosure, the air vent 480 may be implemented alone in the housing (e.g., front plate (e.g., front plate 320 in FIG. 3) and/or rear plate 380) of the electronic device 300 without the connection structure of a connection passage based on an adhesive member.

The electronic device according to various embodiments of the disclosure includes an air vent having a structure for reducing the water pressure of moisture introduced from the outside to prevent damage to the breathable waterproof member due to high water pressure, contributing to a smooth waterproof function and smooth inflow of outside air at the same time.

According to various embodiments of the disclosure, an electronic device (e.g., the electronic device 300 in FIG. 4) may include a housing (e.g., the housing 110 in FIG. 1) including an opening (e.g., an opening 3801 in FIG. 4) connected to the internal space, a first cover (e.g., a first cover 400 in FIG. 6) that is disposed in the housing to close the opening and includes a first surface (e.g., first surface 4101 in FIG. 6) facing the outside and a second surface (e.g., a second surface 4102 in FIG. 6) facing the internal space, at least one air vent (e.g., an air vent 420 in FIG. 6) that is formed from the first surface to the second surface in at least some region of the first cover to connect the outside of the electronic device to the internal space, and includes a first space (e.g., a first space 421) formed to have a specified depth in a direction from the first surface to the second surface and a second space (e.g., a second space 422 in FIG. 6) formed to have a specified depth in a direction from the second surface to the first surface, wherein the first space and the second space are connected so as to partially overlap each other or so as not to overlap each other when the first surface is viewed from above, and a breathable waterproof member (e.g., a breathable waterproof member 700 in FIG. 6) disposed to close the second space in the second surface.

In various embodiments of the disclosure, the at least one air vent may further include at least one third space (e.g., third space 433 in FIG. 8A) connecting the first space and the second space between the first space and the second space.

In various embodiments of the disclosure, the first space, the second space, and/or the at least one third space may be formed to have a circular, elliptical, or polygonal cross-section.

In various embodiments of the disclosure, the at least one air vent may further include at least one protrusion (e.g., protrusion 4401 in FIG. 8B) projecting in a direction toward at least one of the first space, the second space, or the third space.

In various embodiments of the disclosure, the at least one air vent may be formed to become wider as going in a direction from the first space to the second space.

In various embodiments of the disclosure, the electronic device may further include a second cover (e.g., second cover 600 of FIG. 6) disposed to cover the at least one air vent in the first surface of the first cover, and an adhesive member (e.g., adhesive member 500 in FIG. 6) disposed between the first cover and the second cover, wherein the adhesive member may include a connection passage (e.g., connection passage 510 in FIG. 5A) connecting the at least one air vent and the outside between the first cover and the second cover.

In various embodiments of the disclosure, the at least one air vent may include a first air vent (e.g., first air vent 420 in FIG. 5A) disposed at a designated position of the first cover and a second air vent (e.g., second air vent 420' in FIG. 5A) disposed near the first air vent.

In various embodiments of the disclosure, the connection passage may include a first passage (e.g., first passage 5101 in FIG. 5A) connected to the outside, a second passage (e.g., second passage 5102 in FIG. 5A) branching from the first passage and connected to the first air vent, and a third passage (e.g., third passage 5103 in FIG. 5A) branching from the first passage and connected to the second air vent.

In various embodiments of the disclosure, the second passage and the third passage may branch from the same portion of the first passage.

In various embodiments of the disclosure, the second passage and the third passage may branch from different portions of the first passage.

In various embodiments of the disclosure, the second cover may include a window that induces at least one sensor module disposed in the internal space to detect the external environment.

In various embodiments of the disclosure, the at least one sensor module may include a camera device (e.g., camera module 112 in FIG. 2) or an optical system sensor (e.g., sensor module 119 in FIG. 2).

In various embodiments of the disclosure, the breathable waterproof member may include at least one of Gore-Tex, a waterproof nonwoven fabric, or a membrane.

In various embodiments of the disclosure, the electronic device may further include a display (e.g., display 101 in FIG. 1) that is disposed in the internal space to be visible from the outside through at least a portion of the housing.

According to various embodiments of the disclosure, an electronic device may include a housing that includes a sealed internal space, a first surface in contact with the outside, and a second surface in contact with the internal space, at least one air vent that is formed from the first surface to the second surface in at least some region of the housing to connect the outside of the electronic device and the internal space, and includes a first space formed to have a specified depth in a direction from the first surface to the second surface and a second space formed to have a specified depth in a direction from the second surface to the first surface, wherein the first space and the second space are connected so as to partially overlap each other or so as not to overlap each other when the first surface is viewed from above, and a breathable waterproof member disposed to close the second space in the second surface.

In various embodiments of the disclosure, the at least one air vent may further include at least one third space connecting the first space and the second space between the first space and the second space.

In various embodiments of the disclosure, the at least one air vent may further include at least one protrusion projecting in a direction toward at least one of the first space, the second space, or the third space.

According to various embodiments of the disclosure, an electronic device may include a housing that includes a front plate, a rear plate spaced apart from the front plate and including an opening, and a side frame surrounding an internal space between the front plate and the rear plate, at least one camera device arranged in the internal space, a cover that is disposed on the rear plate to close the opening, and includes a first surface facing the outside, a second surface facing the internal space, and at least one through hole formed at a position corresponding to the at least one camera device, at least one air vent that is formed from the first surface to the second surface in at least some region of the cover to connect the outside of the electronic device to the internal space, and includes a first space formed to have a specified depth in a direction from the first surface to the second surface and a second space formed to have a specified depth in a direction from the second surface to the first surface, wherein the first space and the second space are connected so as to partially overlap each other or so as not to overlap each other when the first surface is viewed from above, the at least one air vent including a first air vent and a second air vent, a window attached to the cover through an adhesive tape to cover the at least one air vent, a connection passage that is formed on the adhesive tape and connects the outside of the electronic device to the at least one air vent through a space between the window and the cover, and includes a first passage connected to the outside, a second passage branching from the first passage and connected to the first air vent, and a third passage branching from the first passage and connected to the second air vent, and a breathable waterproof member disposed to close the second space in the second surface.

In various embodiments of the disclosure, the at least one air vent may further include at least one third space connecting the first space and the second space between the first space and the second space.

In various embodiments of the disclosure, the at least one air vent may further include at least one protrusion projecting in a direction toward at least one of the first space, the second space, or the third space.

While the disclosure has been shown and described with reference to various embodiments thereof, it should be understood by those skilled in the art that various changes in form and details may be made therein without departing from the spirit and scope of the disclosure as defined by the appended claims and their equivalents.

What is claimed is:

1. An electronic device comprising:
    a housing including an opening;
    at least one sensor module disposed in an internal space of the housing to detect an external environment;
    a first cover that is disposed in the housing to close the opening and comprises a first surface facing an outside and a second surface facing the internal space of the housing;
    at least one air vent that is formed from the first surface to the second surface in at least some region of the first cover to connect the outside of the electronic device to the internal space and comprises:
        a first space formed to have a specified depth in a direction starting from the first surface to the second surface;
        a second space formed to have a specified depth in a direction starting from the second surface to the first surface, the second space being disposed to overlap the first space when the first surface is viewed from above;
        at least one third space connecting the first space and the second space between the first space and the second space, the at least one third space being disposed at a position not overlapping the first space and the second space when the first surface is viewed from above; and
        at least one protrusion projecting in a direction toward the at least one third space between the first space and the second space,
    wherein the at least one protrusion is disposed to overlap the first space and the second space when the first surface is viewed from above;
    a breathable waterproof member disposed to close the second space in the second surface;
    a second cover disposed to cover the at least one air vent in the first surface of the first cover; and
    an adhesive member disposed between the first cover and the second cover,
    wherein the adhesive member includes a connection passage connecting the outside and the at least one air vent between the first cover and the second cover, and
    wherein the at least one sensor module is disposed to detect the external environment through the second cover.

2. The electronic device of claim 1, wherein the first space, the second space, and/or the at least one third space are formed to have a circular, elliptical, or polygonal cross-section.

3. The electronic device of claim 1, wherein the at least one air vent is formed to become wider going in a direction from the first space to the second space.

4. The electronic device of claim 1, wherein the at least one air vent comprises a first air vent disposed at a designated position of the first cover and a second air vent disposed adjoining the first air vent.

5. The electronic device of claim 4, wherein the connection passage comprises:
    a first passage connected to the outside;
    a second passage branching from the first passage and connected to the first air vent; and
    a third passage branching from the first passage and connected to the second air vent.

6. The electronic device of claim 5, wherein the second passage and the third passage branch from an identical portion of the first passage.

7. The electronic device of claim 5, wherein the second passage and the third passage branch from different portions of the first passage.

8. The electronic device of claim 1, wherein the at least one sensor module comprises a camera device or an optical system sensor.

9. The electronic device of claim 1, wherein the breathable waterproof member comprises at least one of a waterproof nonwoven fabric or a membrane.

10. The electronic device of claim 1, further comprising a display that is disposed in the internal space to be visible from the outside through at least a portion of the housing.

11. An electronic device comprising:
    a housing that comprises a sealed internal space, a first surface in contact with an outside, and a second surface in contact with the sealed internal space;
    at least one air vent that is formed from the first surface to the second surface in at least some region of the housing to connect the outside of the electronic device and the sealed internal space and comprises:
        a first space formed to have a specified depth in a direction starting from the first surface to the second surface; and
        a second space formed to have a specified depth in a direction starting from the second surface to the first surface, the second space being disposed to overlap the first space when the first surface is viewed from above;

at least one third space connecting the first space and the second space between the first space and the second space, the at least one third space being disposed at a position not overlapping the first space and the second space when the first surface is viewed from above; and at least one protrusion projecting in a direction toward the at least one third space between the first space and the second space, wherein the at least one protrusion is disposed to overlap the first space and the second space when the first surface is viewed from above; and a breathable waterproof member disposed to close the second space in the second surface.

12. An electronic device comprising:

a housing that includes a front plate, a rear plate spaced apart from the front plate and including an opening, and a side frame surrounding an internal space between the front plate and the rear plate;

at least one camera device arranged in the internal space;

a first cover that is disposed on the rear plate to close the opening and comprises a first surface facing an outside, a second surface facing the internal space, and at least one through hole formed at a position corresponding to the at least one camera device;

at least one air vent that is formed from the first surface to the second surface in at least some region of the first cover to connect the outside of the electronic device to the internal space and comprises:

a first space formed to have a specified depth in a direction starting from the first surface to the second surface; and a second space formed to have a specified depth in a direction starting from the second surface to the first surface, the second space being disposed to overlap the first space when the first surface is viewed from above;

at least one third space connecting the first space and the second space between the first space and the second space, the at least one third space being disposed at a position not overlapping the first space and the second space when the first surface is viewed from above; and at least one protrusion projecting in a direction toward the at least one third space between the first space and the second space, wherein the at least one protrusion is disposed to overlap the first space and the second space when the first surface is viewed from above, and wherein the at least one air vent including a first air vent and a second air vent;

a second cover attached to the first cover through an adhesive tape to cover the at least one air vent;

a connection passage that is formed on the adhesive tape and connects the outside of the electronic device to the at least one air vent through a space between the first cover and the second cover and comprises:

a first passage connected to the outside;

a second passage branching from the first passage and connected to the first air vent; and a third passage branching from the first passage and connected to the second air vent; and a breathable waterproof member disposed to close the second space in the second surface.

* * * * *